United States Patent
Sandhu et al.

(10) Patent No.: US 6,362,114 B1
(45) Date of Patent: Mar. 26, 2002

(54) SEMICONDUCTOR PROCESSING METHODS OF FORMING AN OXYNITRIDE FILM ON A SILICON SUBSTRATE

(75) Inventors: Gurtej S. Sandhu; Pierre C. Fazan, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/514,415

(22) Filed: Feb. 28, 2000

Related U.S. Application Data

(63) Continuation of application No. 08/747,982, filed on Nov. 12, 1996.

(51) Int. Cl.$^7$ ............................................... H01L 21/02
(52) U.S. Cl. ........................ 438/774; 438/769; 438/770; 437/239; 437/243; 437/244
(58) Field of Search ................................ 437/239, 243, 437/244; 438/770, 774, 769

(56) References Cited

U.S. PATENT DOCUMENTS

| | | | | |
|---|---|---|---|---|
| 5,043,224 A | * | 8/1991 | Jaccodine et al. | 428/446 |
| 5,180,435 A | | 1/1993 | Markunas et al. | 118/723 |
| 5,264,396 A | * | 11/1993 | Thakur et al. | 437/238 |
| 5,360,769 A | | 11/1994 | Thakur et al. | 437/239 |
| 5,397,720 A | * | 3/1995 | Kwong et al. | 437/40 |
| 5,541,141 A | * | 7/1996 | Cho | 437/239 |
| 5,552,337 A | | 9/1996 | Kwon et al. | 437/60 |
| 5,674,788 A | * | 10/1997 | Wristers et al. | 437/239 |
| 5,712,208 A | * | 1/1998 | Tseng et al. | 438/770 |
| 5,738,909 A | * | 4/1998 | Thakur et al. | 427/255.4 |
| 5,763,021 A | | 6/1998 | Young et al. | 427/579 |
| 6,147,011 A | | 11/2000 | Derderian et al. | |

FOREIGN PATENT DOCUMENTS

| | | | |
|---|---|---|---|
| JP | 62-92328 | 4/1987 | |
| JP | 05198573 | 8/1993 | |
| JP | 5198574 | 8/1993 | |
| JP | 5343421 | 12/1993 | |
| WO | 92/20833 | 11/1992 | |
| WO | WO-9220833 | * 11/1992 | ........... C23C/16/00 |

OTHER PUBLICATIONS

Wolf, Silicon Processing for the VLSI Era, vol. 1, teaches oxidation at 1 atm 9p. 217 (No date).*
R.V. Giridhar et al., "SF$_6$ Enhanced Nitridation of Silicon in Active Nitrogen", Appl. Phys. Lett. 45(5), Sep. 1, 1984, pp. 578–580.
M. Morita, et al., "Low–temperature SiO$_2$ growth using fluorine–enhanced thermal oxidation", Appl. Phys. Lett. 47(3), Aug. 1, 1985, pp. 253–255.
M. Morita et al., "A New SiO$_2$ Growth By Fluorine–Enhanced Thermal Oxidation", IEDM 1984, pp. 144–147.
Wolf, Stanley, Silicon Processing for the VLSI Era, vol. 3, pp. 654–658, 1995.
Ting, W. et al., Appl. Phys. Lett., 57 (26), pp 2808–2810, Dec. 24, 1990.
Sun, S.C. et al., Mat. Res. Soc. Symp. Proc. vol. 387, 1995 Materials Research Society, pp. 241–245.

* cited by examiner

Primary Examiner—Tuan H. Nguyen
Assistant Examiner—Lisa Kilday
(74) Attorney, Agent, or Firm—Wells, St. John, Roberts, Gregory & Matkin

(57) ABSTRACT

A semiconductor processing method of forming an oxynitride film on a silicon substrate comprises placing a substrate in a reactor, the substrate having an exposed silicon surface, and combining nitrogen, oxygen, and fluorine in gaseous form in the reactor under temperature and pressure conditions effective to grow an oxynitride film on the exposed silicon surface. According to a preferred aspect, the nitrogen and the oxygen are provided in the reactor from decomposition of a compound containing atomic nitrogen and oxygen. A semiconductor processing method of forming a dielectric composite film on a silicon substrate is also described.

8 Claims, 1 Drawing Sheet

SEMICONDUCTOR PROCESSING METHODS OF FORMING AN OXYNITRIDE FILM ON A SILICON SUBSTRATE

RELATED PATENT DATA

This patent is a continuation application of U.S. patent application Ser. No. 08/747,982, which was filed on Nov. 12, 1996, entitled "Semiconductor Processing Methods of Forming an Oxynitride Film on a Silicon Substrate," naming Gurtej S. Sandhu, Pierre C. Fazan as inventors, and which is now abandoned, the disclosure of which is incorporated by reference.

TECHNICAL FIELD

This invention relates to semiconductor processing methods of forming an oxynitride film ($SiO_xN_y$) on a silicon substrate.

BACKGROUND OF THE INVENTION

Semiconductor processing almost always involves growing some type of film on a substrate. One type of film is a dielectric film. Dielectric films are useful when integrated circuit elements, such as capacitors, are desired to be formed. One type of integrated circuitry which utilizes capacitors is integrated memory circuitry such as dynamic random access memories or memory arrays (DRAMs).

A material which is useful as a dielectric film is $SiO_x$ (predominately $SiO_2$) which can be grown upon a silicon substrate. Such dielectric films can be grown by exposing a silicon substrate to an oxidizing agent under temperature and pressure conditions which are effective to grow such films. Such exposing may take place in a chemical vapor deposition (CVD) reactor. One prior art oxidizing agent for producing $SiO_x$ is $N_2O$. Another useful dielectric material is oxynitride. Such is typically represented by the formula $SiO_xN_y$, where "x" equals 1 and "y" equals 1. $N_2O$ has also been used in the prior art as an oxidant for producing oxynitride films. Oxynitride films grown using $N_2O$ and other gases can form as a composite of an oxynitride layer and overlying silicon dioxide layer.

Unfortunately, the oxynitride layer results in a self-limiting growth process which typically limits the desired thickness of the finished layer. Such results from the oxynitride layer blocking diffusion of the reactant species to the silicon substrate interface where the reaction predominately occurs.

It would be desirable to develop improved methods of producing oxynitride dielectric layers that enhance at least one of the resultant desired thickness or growth rate.

SUMMARY OF THE INVENTION

A semiconductor processing method comprises forming an oxynitride film on a substrate. In accordance with a preferred aspect, a substrate having an exposed silicon surface is placed in a reactor. Subsequently, nitrogen, oxygen and fluorine gases are combined in the reactor under conditions which are effective to grow an oxynitride film on the exposed silicon surface. According to one preferred implementation, the nitrogen and oxygen gases are provided in the reactor from decomposition of a compound containing atomic nitrogen and oxygen. According to another preferred implementation, separate nitrogen, oxygen and fluorine source gases are fed into the reactor. In accordance with another preferred aspect, the substrate is exposed to rapid thermal processing conditions which are effective to grow an oxynitride film on an exposed silicon surface. In accordance with yet another aspect of the invention, a dielectric composite film is formed on an exposed silicon surface by combining nitrogen, oxygen, and fluorine in gaseous form in a reactor under temperature and pressure conditions, effective to grow a dielectric composite film which includes a first oxynitride layer proximate the silicon surface, and a second layer atop the first layer comprising $SiO_x$.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes several aspects. In accordance with one aspect of the invention, a semiconductor processing method of forming an oxynitride film on a silicon substrate comprises:

placing a substrate in a reactor, the substrate having an exposed silicon surface; and combining nitrogen, oxygen, and fluorine in gaseous form in the reactor under temperature and pressure conditions effective to grow an oxynitride film on the exposed silicon surface, the nitrogen and the oxygen being provided in the reactor from decomposition of a compound containing atomic nitrogen and oxygen.

In accordance with another aspect of the invention, a semiconductor processing method of forming an oxynitride film on a silicon surface comprises:

placing a substrate in a reactor, the substrate having an exposed silicon surface; and feeding separate a) nitrogen, b) oxygen, and c) fluorine source gases into the reactor under conditions effective to grow an oxynitride film on the silicon surface.

In accordance with still a further aspect of the invention, a semiconductor processing method of forming an oxynitride film on a silicon substrate comprises:

placing a silicon substrate in a reactor, the silicon substrate having an exposed silicon surface;

combining nitrogen, oxygen, and fluorine in gaseous form in the reactor; and subjecting the silicon substrate within the reactor to a temperature greater than about 700 degrees Celsius for a time sufficient to grow an oxynitride film on the exposed silicon surface.

In accordance with yet another aspect of the invention, a semiconductor processing method of forming an oxynitride film on a silicon surface comprises:

placing a substrate in a reactor, the substrate having an exposed silicon surface;

feeding separate a) nitrogen, b) oxygen, and c) fluorine source gases into the reactor; and exposing the substrate within the reactor to rapid thermal processing (RTP) conditions which are effective to grow an oxynitride film on the silicon surface.

In accordance with still another aspect of the invention, a semiconductor processing method of forming a dielectric composite film on a silicon substrate comprises the steps of:

placing a substrate in a reactor, the substrate having an exposed silicon surface; and combining nitrogen, oxygen, and fluorine in gaseous form in the reactor under temperature and pressure conditions effective to grow a dielectric composite film comprising a first oxynitride layer proximate the silicon surface, and a second layer atop the first layer comprising $SiO_x$.

Figure 1:
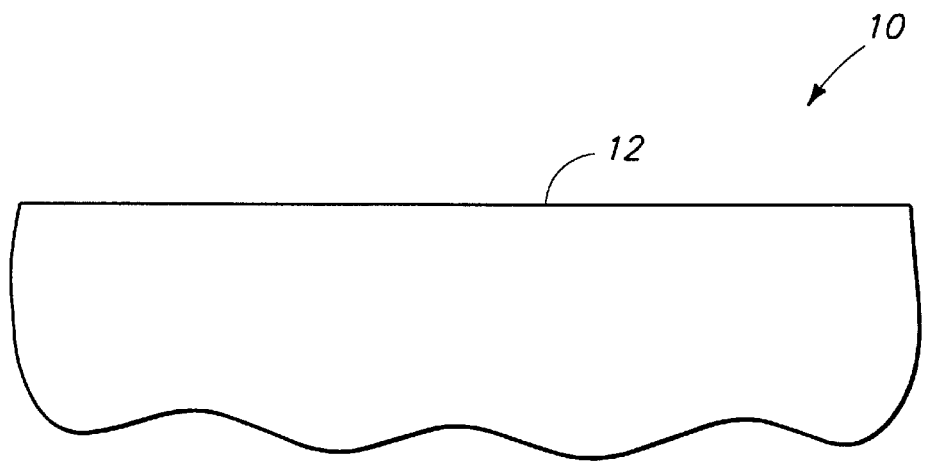
FIG. 1 is a diagrammatic representation of a fragment of a substrate processed in accordance with the invention.
Figure 2:
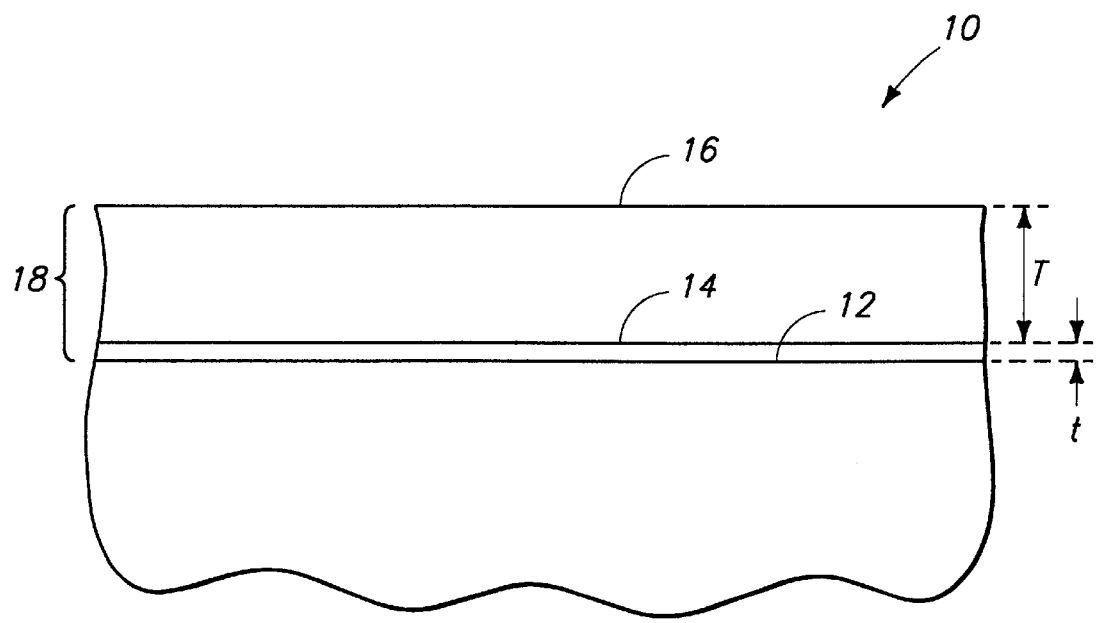
FIG. 2 is a view of the FIG. 1 substrate fragment at a processing step subsequent to that shown by FIG. 1.

Referring to FIGS. 1 and 2, a semiconductor wafer fragment in process is indicated with reference numeral 10. Fragment 10 is preferably a monocrystalline silicon substrate having an outer exposed silicon surface 12. In accordance with the preferred methods, fragment or substrate 10 is placed in a suitable chemical vapor deposition reactor, and preferably a rapid thermal processing (RTP) reactor. In such reactor, various gases are reacted under temperature and pressure conditions which are effective to grow a composite dielectric film to a thicker degree and at a faster rate of growth than was previously possible.

In the preferred embodiments, following placement of substrate 10 in a suitable RTP reactor, gaseous forms of nitrogen, oxygen, and fluorine are introduced and combined under temperature and pressure conditions which are effective to grow a dielectric composite film 18 (FIG. 2). Film 18 includes a first oxynitride ($SiO_xN_y$) layer or film 14 having a thickness "t" proximate or adjacent silicon surface 12. Film 18 also includes a second layer 16 having a thickness "T" atop first layer 14. As shown, thickness "T" is greater than thickness "t". Preferably, the second layer comprises $SiO_x$.

According to one preferred aspect of the invention, the nitrogen and the oxygen are provided in the reactor from decomposition of a compound containing atomic nitrogen and oxygen, which preferably is $N_2O$. It is possible, however, for separate nitrogen, oxygen, and fluorine source gases to be fed into or provided in the reactor and reacted to form or grow the preferred composite film. Preferably, the fluorine is provided in the reactor by decomposition of $NF_3$. Other fluorine-rich gases, such as $SF_6$, $CF_4$, or $C_2F_6$, may be used to achieve higher growth rates and greater thicknesses for oxynitride films in accordance with the invention. A preferred quantity of fluorine, by volume in the reactor, comprises less than about 10% of the aggregate volume of the gases which are fed thereinto. A more preferred volumetric quantity of fluorine comprises below about 5% of the aggregate volume, and even more preferred, comprises less than or equal to about 3% of the aggregate gaseous volume which is fed or combined in the reactor.

As mentioned above, the nitrogen, oxygen, and fluorine gases, whether separately fed or introduced into the reactor or not, are placed under or subjected to preferred temperature conditions which are effective to grow dielectric composite film 18. Such preferred temperature conditions include an ambient temperature which is greater than about 700° C., and preferably between 700° C. to 1150° C. Such temperature condition is maintained for a period of time sufficient to grow oxynitride film 14 to a desired thickness on the exposed silicon surface. According to one preferred processing method, the substrate is exposed within the reactor to rapid, thermal processing (RTP) conditions which are effective to grow oxynitride film 14 on silicon surface 12 in about 20 seconds or less, and preferably about 10 seconds. Such RTP processing preferably takes place at reactor pressures from between 0.1 Torr to 760 Torr. Alternatively, and according to another preferred processing method, a hot wall furnace is utilized to produce ambient temperatures in the range from 700° C. to 1150° C. Such temperatures are most preferably maintained for a period of time which is sufficient to grow oxynitride film 14, and hence composite film 18, in less or equal to about 30 minutes. It should be understood, however, that an ambient temperature exposure for a time duration from about 10 seconds to 30 minutes may grow film 14 to a desired thickness depending on which type of thermal processing i.e. RTP, hot wall, etc . . . is used. Other ways of achieving the preferred temperature range will be apparent to those of skill in the art.

FIG. 2 shows that composite dielectric film 18 includes two thickness components, "T" and "t", which are different from one another. An example thickness ratio between second layer 16 and first layer 14 is not more than about 100:1. The overall thickness ("T"+"t") may vary depending on desired processing conditions. The thicknesses achievable according to the present invention represent an improvement over previously attainable thicknesses, such improvement being capable of being achieved at oxidation rates which are at least one order of magnitude greater than previous oxidation rates.

An additional advantage of the present invention is that during composite formation, atomic fluorine migrates to the interface between surface 12 and layer 14. Such fluorine presence at the interface increases or enhances the long term reliability of the formed oxide (layer 16) and oxynitride layer 14. Such enhanced reliability is achieved in terms of improved time dependent dielectric breakdown characteristics which stem from mitigating the effects of hot carrier injection which, over time, can reduce the effectiveness of dielectric layers. Utilization of fluorine in the above manner in conjunction with an oxynitride film growth is understood to also result in the improved thickness and growth rate characteristics of oxynitride films.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for forming a dielectric film on a semiconductor substrate comprising:

placing the semiconductor substrate in a reactor, the substrate having an exposed silicon surface;

providing into the reactor, separate nitrogen, oxygen and fluorine source gases, the fluorine source gases being less than or equal to about 3% of the aggregate gaseous volume which is fed into the reactor and comprising $SF_6$;

providing within the reactor rapid thermal processing (RTP) conditions at about atmospheric pressure for exposing the semiconductor substrate to such conditions;

growing a first portion of the dielectric film, the first portion comprising an oxynitride layer on the silicon surface having a first thickness; and growing a second portion of the dielectric film overlying the first portion, the second portion comprising a predominately $SiO_2$ layer having a second thickness, wherein the first and second portions have a thickness ratio of second thickness-to-first thickness of not more than about 100:1.

2. The method for forming a dielectric film of claim 1, wherein providing the source gases comprises providing nitrous oxide ($N_2O$) gas.

3. The method for forming a dielectric film of claim 1, wherein providing within the reactor rapid thermal processing (RTP) conditions comprises an ambient temperature within the reactor of greater than about 700 degrees Celsius.

4. A semiconductor processing method for forming a dielectric film on a silicon surface comprising:

placing a semiconductor substrate into a reactor, the substrate having an exposed silicon surface;

feeding separate a) nitrogen, b) oxygen, and c) fluorine source gases into the reactor, the fluorine source gases comprising $SF_6$; and exposing the substrate within the reactor to rapid thermal processing (RTP) conditions at about atmospheric pressure to grow a first silicon oxynitride layer on the exposed silicon surface, the first layer having a first thickness, and to subsequently grow a second layer comprising predominately $SiO_2$ atop the first layer, the second layer having a second thickness, wherein a thickness ratio of second thickness-to-first thickness of not more than about 100:1 is defined.

5. The semiconductor processing method of claim 4 wherein feeding separate source gases into the reactor comprises feeding source gases into the reactor such that a volume of fluorine is less than or equal to about 3% of the aggregate gaseous volume which is fed into the reactor.

6. The semiconductor processing method of claim 4 wherein feeding separate source gases into the reactor comprises feeding $SF_6$ into the reactor.

7. The semiconductor processing method of claim 4, wherein providing within the reactor rapid thermal processing (RTP) conditions comprises an ambient temperature within the reactor of greater than about 700 degrees Celsius.

8. The semiconductor processing method of claim 4, wherein providing the source gases comprises providing nitrous oxide ($N_2O$) gas.

* * * * *